United States Patent
Tominaga et al.

(10) Patent No.: US 9,666,446 B2
(45) Date of Patent: May 30, 2017

(54) ETCHING METHOD

(71) Applicant: Tokyo Electron Limited, Tokyo (JP)

(72) Inventors: Sho Tominaga, Miyagi (JP); Wataru Takayama, Miyagi (JP); Yoshiki Igarashi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/131,221

(22) Filed: Apr. 18, 2016

(65) Prior Publication Data

US 2016/0314986 A1 Oct. 27, 2016

(30) Foreign Application Priority Data

Apr. 22, 2015 (JP) .................................. 2015-087900

(51) Int. Cl.
*H01L 21/311* (2006.01)

(52) U.S. Cl.
CPC .............................. *H01L 21/31116* (2013.01)

(58) Field of Classification Search
None
See application file for complete search history.

(56) References Cited

U.S. PATENT DOCUMENTS

| | | | | |
|---|---|---|---|---|
| 9,536,707 B2* | 1/2017 | Ishita | ................ | H01J 37/32091 |
| 2013/0059450 A1* | 3/2013 | Le Gouil | ............ | H01L 21/3065 |
| | | | | 438/715 |
| 2015/0037982 A1* | 2/2015 | Ogawa | .............. | H01J 37/32091 |
| | | | | 438/715 |
| 2015/0243521 A1* | 8/2015 | Ogawa | .............. | H01L 21/31116 |
| | | | | 438/714 |
| 2015/0303069 A1* | 10/2015 | Narishige | ......... | H01L 27/11556 |
| | | | | 438/696 |
| 2016/0218015 A1* | 7/2016 | Oomori | ............. | H01L 21/32137 |
| 2016/0293440 A1* | 10/2016 | Nagatomo | ........ | H01L 21/31116 |
| 2016/0336191 A1* | 11/2016 | Saitoh | ............... | H01L 21/31116 |

FOREIGN PATENT DOCUMENTS

| | | |
|---|---|---|
| JP | S62-50978 | 10/1987 |
| JP | H7-22393 | 1/1995 |
| JP | H7-22149 | 3/1995 |
| JP | 2956524 | 10/1999 |

* cited by examiner

*Primary Examiner* — Allan Olsen
(74) *Attorney, Agent, or Firm* — IPUSA, PLLC (57) ABSTRACT

An etching method includes generating a plasma from a hydrogen-containing gas and a fluorine-containing gas with high-frequency electric power for plasma generation. A first film including a silicon oxide film and a silicon nitride film is etched with the generated plasma in an environment at a temperature lower than or equal to −30° C. The first etch rate of first etching that etches the first film and the second etch rate of second etching that etches a second film having a structure different from the structure of the first film are controlled, so that the difference between the first etch rate and the second etch rate is within ±20% of the first etch rate.

13 Claims, 12 Drawing Sheets

|  | DEPTH (nm) | E/R (nm/min) |
|---|---|---|
| LAMINATED FILM ETCHING | 987 | 658 |
| SINGLE-LAYER FILM ETCHING | 541 | 361 |
| DIFFERENCE | 446 | 297 |

ETCHING METHOD

CROSS-REFERENCE TO RELATED APPLICATION

This application is based upon and claims the benefit of priority of Japanese Patent Application No. 2015-087900, filed on Apr. 22, 2015, the entire contents of which are incorporated herein by reference.

BACKGROUND OF THE INVENTION

1. Field of the Invention

The present invention generally relates to etching methods.

2. Description of the Related Art

A method for forming holes of a high aspect ratio in a silicon oxide film by etching in a low temperature environment has been proposed. (See, for example, Japanese Laid-Open Patent Application No. 7-22393.) For example, in manufacturing three-dimensional stacked semiconductor memories such as 3D NAND flash memories, it is possible to form holes or grooves of a high aspect ratio in a laminated film of silicon oxide films and silicon nitride films and in a single-layer silicon oxide film by etching using the above-described method. For related art, reference may also be made to Japanese Examined Patent Publication No. 62-50978, Japanese Examined Patent Publication No. 7-22149, and Japanese Patent No. 2956524.

SUMMARY OF THE INVENTION

According to an aspect of the present invention, an etching method includes generating a plasma from a hydrogen-containing gas and a fluorine-containing gas with high-frequency electric power for plasma generation, and etching a first film including a silicon oxide film and a silicon nitride film with the generated plasma in an environment at a temperature lower than or equal to −30° C. The etching includes controlling a first etch rate of first etching that etches the first film and a second etch rate of second etching that etches a second film having a structure different from a structure of the first film, so that a difference between the first etch rate and the second etch rate is within ±20% of the first etch rate.

According to an aspect of the present invention, an etching method includes generating a plasma from a gas mixture between an upper electrode and a lower electrode by applying high-frequency electric power for plasma generation to the upper electrode or the lower electrode and applying a pulse wave of high-frequency electric power for biasing to the lower electrode, the high-frequency electric power for biasing per unit area being 1.4 W/cm$^2$ to 5.7 W/cm$^2$, the gas mixture including a hydrogen-containing gas and a fluorine-containing gas, controlling first etching and second etching in an environment at a temperature lower than or equal to −30° C., wherein the first etching etches a laminated film of a silicon oxide film and a silicon nitride film with the generated plasma and the second etching etches a single-layer film of a silicon oxide film with the generated plasma, and repeating a first step and a second step a plurality of times, the first step performing the first etching and the second etching under a first process condition that causes an etch rate of the laminated film to be higher than an etch rate of the single-layer film, the second step performing the first etching and the second etching under a second process condition that causes the etch rate of the single-layer film to be higher than the etch rate of the laminated film. The first process condition and the second process condition have different duty ratios.

The object and advantages of the embodiments will be realized and attained by means of the elements and combinations particularly pointed out in the claims.

It is to be understood that both the foregoing general description and the following detailed description are exemplary and explanatory and not restrictive of the invention.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

According to the etching method described in Japanese Laid-Open Patent Application No. 7-22393, in the case of simultaneously processing the laminated film and the single-layer film, the etch rate differs between the films to be etched, so that there is a problem in that the processing time increases to deteriorate productivity.

According to an aspect of the present invention, it is possible to reduce a processing time to improve productivity in the case of etching different kinds of films.

Embodiments of the present invention are described below with reference to the accompanying drawings. In the specification and drawings, the same or substantially the same elements are referred to using the same reference numeral, and a description thereof is not repeated.

Figure 1:
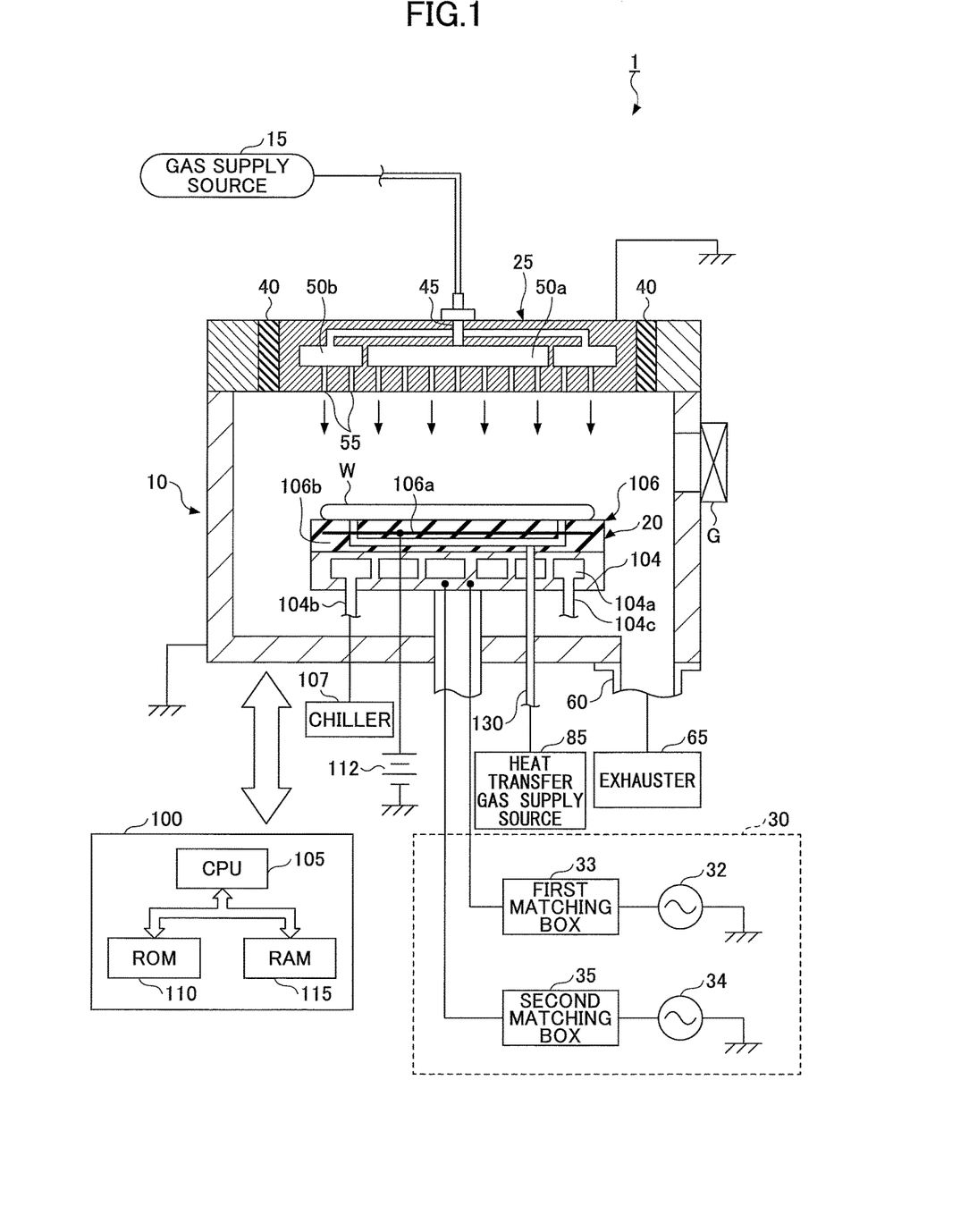
FIG. 1 is a vertical cross-sectional view of an etching apparatus according to a first embodiment and a second embodiment.

First, an etching apparatus 1 according to an embodiment of the present invention is described with reference to FIG. 1. FIG. 1 is a vertical cross-sectional view of the etching apparatus 1. The etching apparatus 1 is a parallel plate plasma processing apparatus (capacitively coupled plasma [CCP] processing apparatus) in which a loading table 20 and a gas shower head 25 are opposed to each other in a chamber 10. The loading table 20 serves to hold a semiconductor wafer (hereinafter simply referred to as "wafer") W and also serves as a lower electrode. The gas shower head 25 serves to supply gas like a shower into the chamber 10 and also serves as an upper electrode.

The chamber 10 is formed of, for example, aluminum having an anodized surface, and has a cylindrical shape. The chamber 10 is electrically grounded. The loading table 20 is placed at the bottom of the chamber 10, and the wafer W is loaded onto the loading table 20. The wafer W is an example of a substrate that is an object of etching. On the wafer W, a mask film is deposited on a silicon oxide film and a silicon nitride film.

The loading table 20 is formed of, for example, aluminum (Al), titanium (Ti) or silicon carbide (SiC). An electrostatic chuck 106 for electrostatically attracting the wafer W is provided on an upper surface of the loading table 20. According to the electrostatic chuck 106, a chuck electrode 106a is held between insulators 106b.

A direct-current (DC) voltage source 112 is connected to the chuck electrode 106a, so that a DC electric current is supplied from the DC voltage source 112 to the chuck electrode 106a. As a result, the wafer W is attracted and adheres to the electrostatic chuck 106 with a Coulomb force.

The loading table 20 is supported by a support 104. A refrigerant channel 104a is formed in the support 104. A refrigerant inlet pipe 104b and a refrigerant outlet pipe 104c are connected to the refrigerant channel 104a. A refrigerant such as cooling water or brine output from a chiller 107 circulates through the refrigerant inlet pipe 104b, the refrigerant channel 104a, and the refrigerant outlet pipe 104c, so that the loading table 20 and the electrostatic chuck 106 are cooled.

A heat transfer gas supply source 85 supplies a heat transfer gas such as helium (He) gas or argon (Ar) gas onto a bottom surface of the wafer W on the electrostatic chuck 106 through a gas supply line 130. According to this configuration, the temperature of the electrostatic chuck 106 is controlled by the refrigerant circulated through the refrigerant channel 104a and the heat transfer gas supplied onto the bottom surface of the wafer W. As a result, it is possible to control the wafer W to a predetermined temperature.

An electric power supply apparatus 30 that supplies dual-frequency superimposed electric power is connected to the loading table 20. The electric power supply apparatus 30 includes a first high-frequency power supply 32 and a second high-frequency power supply 34. The first high-frequency power supply 32 supplies first high-frequency electric power (high-frequency electric power HF for plasma excitation) of a first frequency. The second high-frequency power supply 34 supplies second high-frequency electric power (high-frequency electric power LF for biasing) of a second frequency that is lower than the first frequency. The first high-frequency power supply 32 is electrically connected to the loading table 20 through a first matching box 33. The second high-frequency power supply 34 is electrically connected to the loading table 20 through a second matching box 35. The first high-frequency power supply 32 applies, for example, 40 MHz high-frequency electric power HF for plasma excitation to the loading table 20. The second high-frequency power supply 34 applies, for example, 0.3 MHz high-frequency electric power LF for biasing to the loading table 20. The high-frequency electric power HF, which is applied to the loading table 20 according to this embodiment, may alternatively be applied to the gas shower head 25.

The first matching box 33 matches load impedance to the internal (or output) impedance of the first high-frequency power supply 32. The second matching box 35 matches load impedance to the internal (or output) impedance of the second high-frequency power supply 34. The first matching box 33 operates so that the internal impedance of the first high-frequency power supply 32 and the load impedance apparently match when a plasma is generated in the chamber 10. The second matching box 35 operates so that the internal impedance of the second high-frequency power supply 34 and the load impedance apparently match when a plasma is generated in the chamber 10.

The gas shower head 25 is attached to a ceiling of the chamber 10 through a shield ring 40 that covers a periphery of the gas shower head 25, so as to close an opening in the ceiling. The gas shower head 25 may be electrically grounded as depicted in FIG. 1. Alternatively, the gas shower head 25 may be connected to a variable DC power supply so that a predetermined DC voltage is applied to the gas shower head 25.

A gas introduction port 45 for introducing gas is formed in the gas shower head 25. A center-side diffusion chamber 50a and an edge-side diffusion chamber 50b, which diverge from the gas introduction port 45, are provided in the gas shower head 25. The output gas of a gas supply source 15 is supplied into the diffusion chambers 50a and 50b through the gas introduction port 45, and is diffused in the diffusion chambers 50a and 50b to be introduced into the chamber 10 toward the loading table 20 through multiple gas supply holes 55.

An evacuation port 60 is formed at a bottom surface of the chamber 10, and the chamber 10 is evacuated with an exhauster 65 connected to the evacuation port 60. This makes it possible to maintain the degree of vacuum inside the chamber 10 at a predetermined value. A sidewall of the chamber 10 is provided with a gate valve G. The wafer W is transferred into and out of the chamber 10 by opening and closing the gate valve G.

The etching apparatus 1 includes a control part 100 that controls an operation of the entire etching apparatus 1. The control part 100 includes a central processing unit (CPU) 1, a read-only memory (ROM) 110, and a random access memory (RAM) 115. The CPU 105 executes desired processes such as the below-described etching and discharging in accordance with various recipes (instructions) stored in these storage areas (the ROM 110 and the RAM 115). Apparatus control information for process conditions, including a process time, a pressure (gas discharge), high-frequency electric power, a voltage, various gas flow rates, the internal temperatures of the chamber 10 (such as an upper electrode temperature, a chamber sidewall temperature, an electrostatic chuck temperature), and the temperature of the chiller 107, is written in the recipes. The recipes indicating these programs and processing conditions may be stored in a hard disk drive or a semiconductor memory. Alternatively, the recipes may be contained in a computer-readable portable storage medium such as a CD-ROM or DVD and loaded at predetermined positions in the storage areas.

At the time of etching, the opening and closing of the gate valve G is controlled, so that the wafer W is transferred into the chamber 10 to be loaded onto the loading table 20. A DC electric current is supplied from the DC voltage source 112 to the chuck electrode 106a, so that the wafer W is attracted and adheres to and is held by the electrostatic chuck 106 with a Coulomb force.

Next, an etching gas, high-frequency electric power HF for plasma excitation, and high-frequency electric power LF for biasing are supplied into the chamber 10, so that a plasma is generated. Etching is performed with the generated plasma.

After etching, a DC voltage HV that is opposite in polarity to that at the time of attracting the wafer W is applied from the DC voltage source 112 to the chuck electrode 106a so as to release electric charge from the wafer W, so that the wafer W is removed from the electrostatic chuck 106. The opening and closing of the gate valve G is controlled, so that the wafer W is transferred out of the chamber 10.

First Embodiment

Etching according to a first embodiment is described below.

In the etching of a film to be etched that is formed of a silicon oxide film ($SiO_2$) and a silicon nitride film (SiN) with a plasma of a hydrogen-containing gas and a fluorine-containing gas, there is a process of simultaneously etching the film to be etched and another film to be etched that is different in structure from the film to be etched.

For example, in the manufacture of three-dimensional stacked semiconductor memories such as 3D NAND flash memories, a laminated film of silicon oxide films and silicon nitride films and a single-layer silicon oxide film are subjected simultaneously or in parallel to high aspect ratio etching.

Figure 2A:
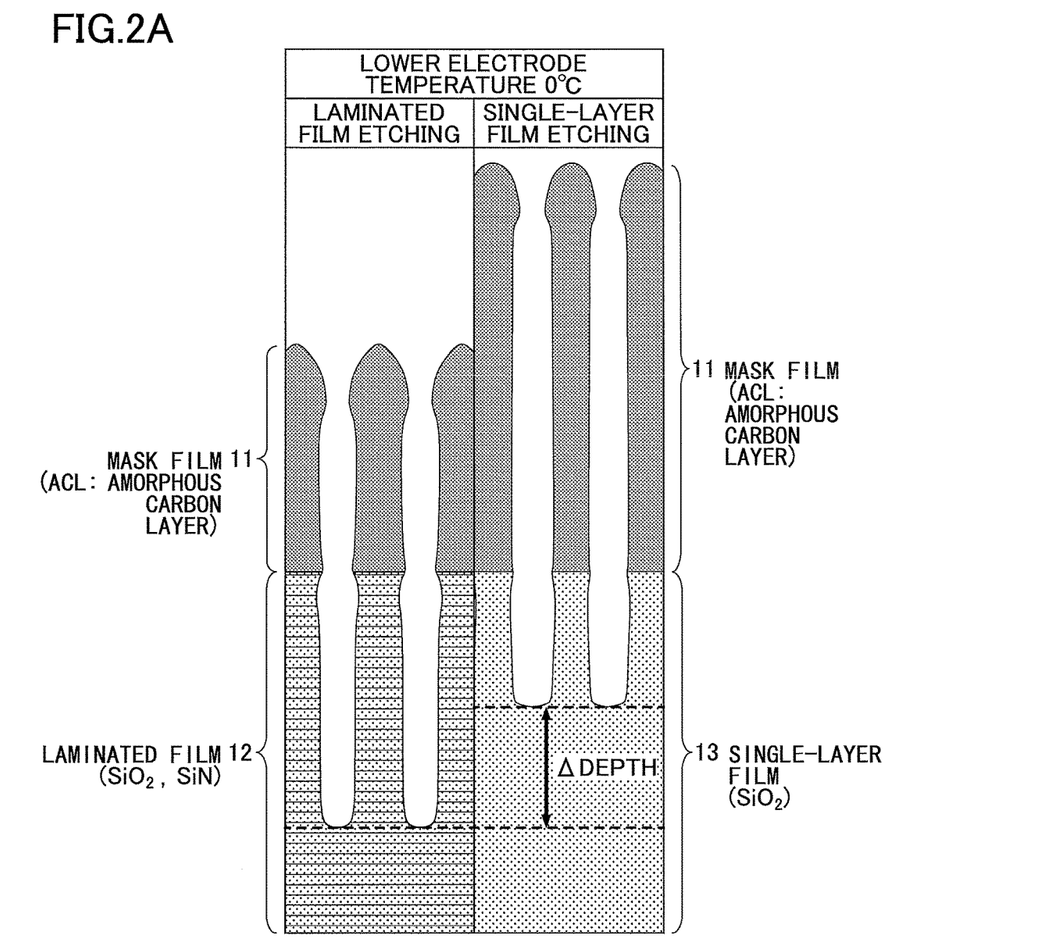
FIGS. 2A and 2B are diagrams depicting an etching result at a low temperature.

In FIG. 2A, a result of etching a laminated film 12 of alternating layers of silicon oxide films and silicon nitride films to the pattern of holes formed in a mask film 11 of ACL (amorphous carbon layer) is depicted on the left. The process of etching the laminated film 12 is an example of first etching, and hereinafter may also be referred to as "laminated film etching."

In FIG. 2A, a result of etching a single layer 13 of a silicon oxide film to the pattern of holes formed in the ACL mask film 11 is depicted on the right. The process of etching the single-layer film 13 is an example of second etching, and hereinafter may also be referred to as "single-layer film etching." The films to be etched by the first etching and the second etching are not limited to these. For example, the films to be etched by the first etching and the second etching may be films that are different in the structure of contained silicon.

The process conditions for the laminated film etching and the single-layer film etching in the case of obtaining the results of FIG. 2A are as follows:
Lower electrode (loading table) temperature: 0° C., and
Gas: $CF_4$ (carbon tetrafluoride) and $H_2$ (hydrogen).

Figure 2B:
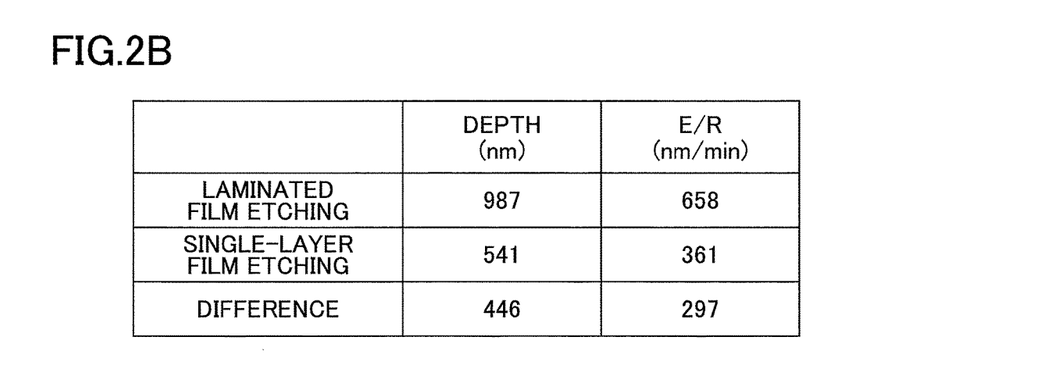

As depicted in FIG. 2B, as a result of performing each of the laminated film etching and the single-layer film etching for a predetermined time, the difference between the depths of holes formed in the laminated film 12 and the single-layer film 13 was 446 nm, and the difference between the etch rate (E/R)s of the laminated film 12 and the single-layer film 13 was 297 nm/min.

When the difference between the etch rates of the laminated film 12 and the single-layer film 13 is such that the etch rate of the laminated film 12 is almost double the etch rate of the single-layer film 13 as described above, the time of the simultaneous or parallel etching of the laminated film 12 and the single-layer film 13 increases to deteriorate productivity. Meanwhile, it is possible to improve productivity if it is possible to control the ratio of the etch rates of the laminated film 12 and the single-layer film 13 to 1:1 or a ratio approximate to 1:1 without decreasing the etch rates.

Figure 3:
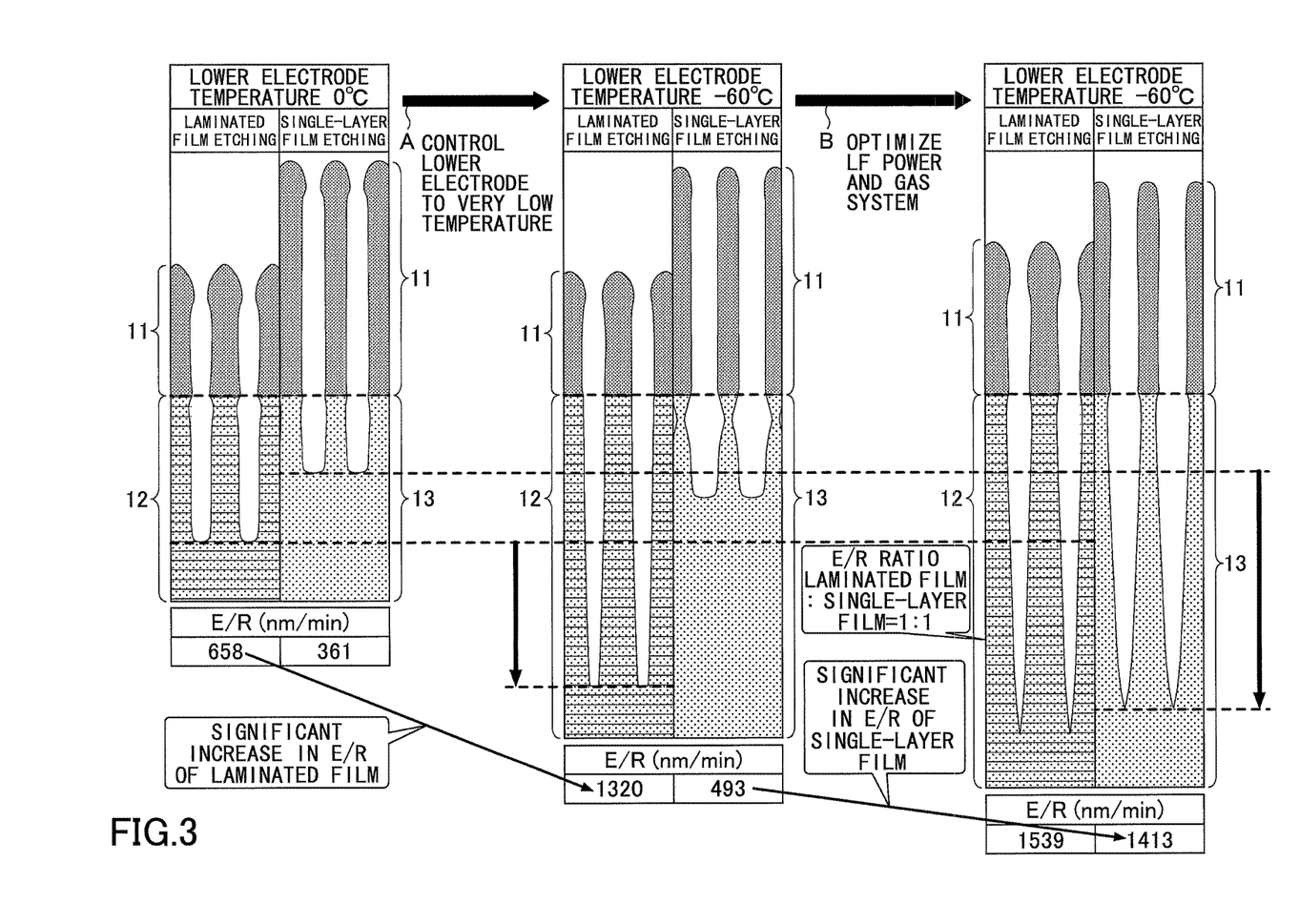
FIG. 3 is a diagram depicting the outline of an etching method according to the first embodiment.

Therefore, according to the etching method of the first embodiment of the present invention, the lower electrode is controlled to a very low temperature as indicated by arrow A in FIG. 3. In FIG. 3, an etching result in the case where a plasma generated from $CF_4$ gas and hydrogen gas was used with the temperature of the lower electrode being 0° C. (low temperature) is depicted on the left, and an etching result in the case where a plasma generated from $CF_4$ gas and hydrogen gas was used with the temperature of the lower electrode being −60° C. is depicted at the center. These results indicate that the etch rate of the laminated film 12 is almost doubled by changing the temperature of the lower electrode from a low temperature to a very low temperature. Meanwhile, the etch rate of the single-layer film 13 is approximately 1.3 times.

That is, when the lower electrode is controlled to a very low temperature, the etch rates of both the laminated film 12 and the single-layer film 13 increase, and in particular, the etch rate of the laminated film 12 significantly increases. As a result, the difference between the etch rates of the laminated film 12 and the single-layer film 13 further increases.

Figure 4:
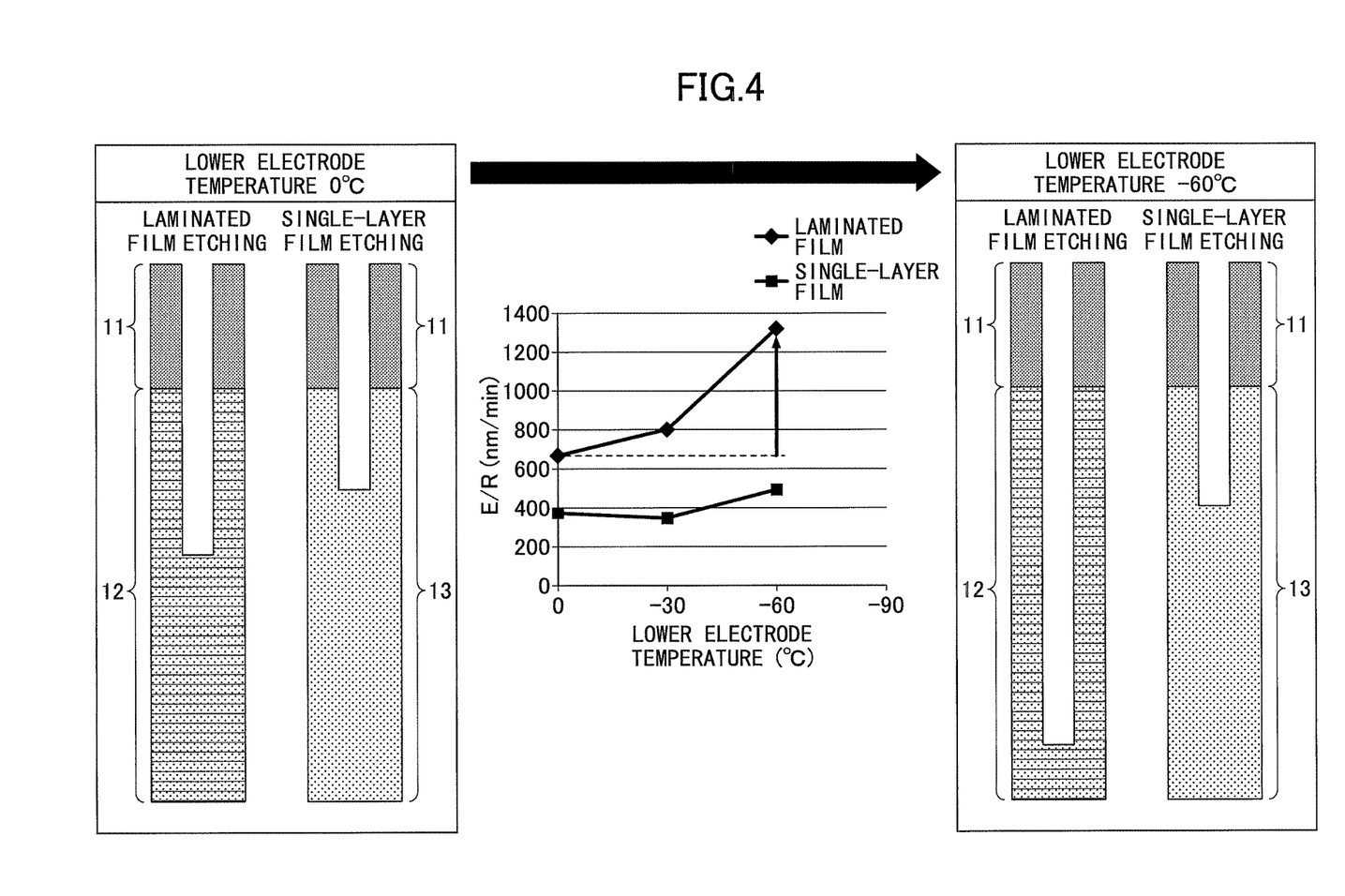
FIG. 4 is a diagram depicting an etching result at a very low temperature according to the first embodiment.

FIG. 4 schematically depicts an etching result in the case where the temperature of the lower electrode was changed from a low temperature to a very low temperature under the following process conditions.

The process conditions for the laminated film etching and the single-layer film etching are as follows:
Lower electrode temperature: changed from 0° C. (low temperature, FIG. 4, left) to −60° C. (very low temperature, FIG. 4, right), and
Gas: $CF_4$, $H_2$, HBr (hydrogen bromide), $NF_3$ (nitrogen trifluoride), $CH_2F_2$ (difluoromethane) and $CH_4$ (methane).

This etching result shows, as indicated by the graph at the center of FIG. 4, that the etch rates of the laminated film 12 and the single-layer film 13 increase as the temperature of the lower electrode decreases at very low temperatures lower than or equal to −30° C. Furthermore, the etch rate of the laminated film 12 is higher than the etch rate of the single-layer film 13, and in particular, the rate of increase of the etch rate of the laminated film 12 is higher than that of the etch rate of the single-layer film 13 at very low temperatures lower than or equal to −30° C. Thus, it is difficult to eliminate a large difference between the etch rates of the laminated film 12 and the single-layer film 13 by controlling the temperature of the lower electrode to a very low temperature alone.

Therefore, according to the etching method of this embodiment, the high-frequency electric power LF for biasing and the supplied gas system are optimized as indicated by arrow B in FIG. 3. This makes it possible to significantly increase the etch rate of the single-layer film 13 in particular as depicted on the right in FIG. 3, so that it is possible to control the ratio of the etch rates of the laminated film 12 and the single-layer film 13 to substantially 1:1. As a result, it is possible to reduce the etching time and accordingly to improve productivity.

Figure 5:
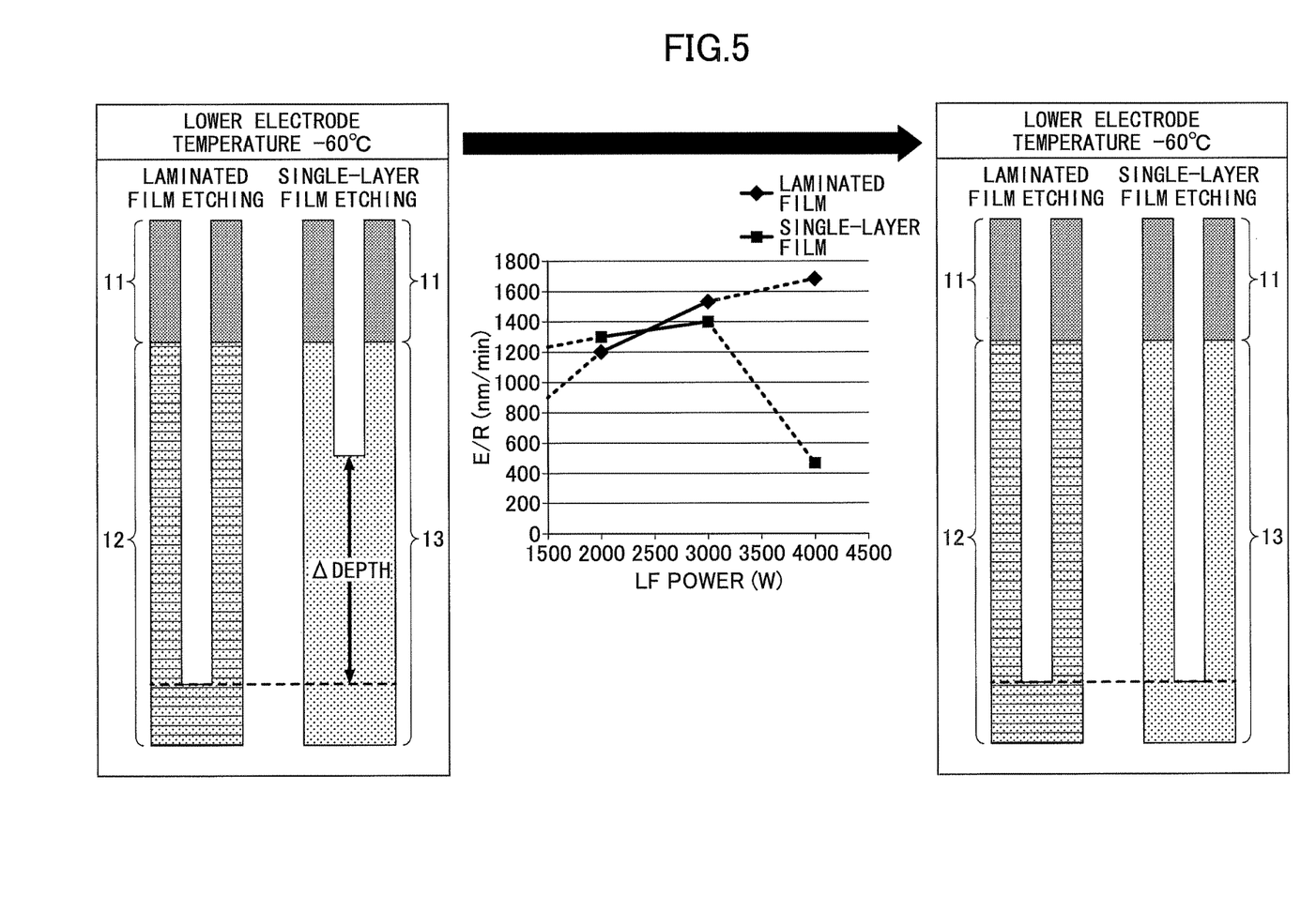
FIG. 5 is a diagram depicting an etching result at a very low temperature according to the first embodiment.

FIG. 5 depicts an etching result in the case where the high-frequency electric power LF for biasing and the gas system were optimized under the following process conditions.

The process conditions for before and after the optimization of the high-frequency electric power LF for biasing and the gas system in the laminated film etching and the single-layer film etching are as follows:

[Before optimization of LF and gas system (FIG. 5, left)]
    Lower electrode temperature: −60° C.,
    Gas: $CF_4$, $H_2$, HBr, $NF_3$, $CH_2F_2$ and $CH_4$, and
    LF: continuous wave.
[After optimization of LF and gas system (FIG. 5, right)]
    Lower electrode temperature: −60° C.,
    Gas: $CF_4$ and $H_2$, and
    LF: pulse wave of a frequency of 0.3 kHz with a duty ratio of 75%. The frequency and the duty ratio of the high-frequency electric power LF are not limited to these.

This etching result shows, as indicated by the graph at the center of FIG. 5, that the ratio of the etch rates of the laminated film 12 and the single-layer film 13 is substantially 1:1 when the effective value of the high-frequency electric power LF is 2000 W to 3000 W at very low temperatures lower than or equal to −30° C.

Thus, according to the etching method of this embodiment, the temperature of the lower electrode is controlled to very low temperatures, and the pulse wave of the high-frequency electric power LF of an effective value of 2000 W to 3000 W is applied. This makes it possible to control the ratio of the etch rates of the laminated film 12 and the single-layer film 13 to 1:1 or a ratio approximate to 1:1 without decreasing the etch rates, so that it is possible to improve productivity.

According to this embodiment, very low temperatures are defined as temperatures lower than or equal to −30° C. The lower electrode according to this embodiment is controlled to very low temperatures within the range of preferably −30° C. to −100° C., and more preferably, −30° C. to −60° C. This makes it possible to bring the ratio of the etch rates of the laminated film 12 and the single-layer film 13 closer to 1:1, so that it is possible to further improve productivity.

According to the etching method of the first embodiment, the high-frequency electric power LF for biasing is controlled to 2000 W to 3500 W. That is, when the effective value of the high-frequency electric power LF for biasing is 2000 W to 3500 W, letting the area of the wafer W be 15·15·3.14 cm², the high-frequency electric power LF for biasing per unit area applied to the lower electrode is 2.8 W/cm² to 5.0 W/cm².

Figure 6:
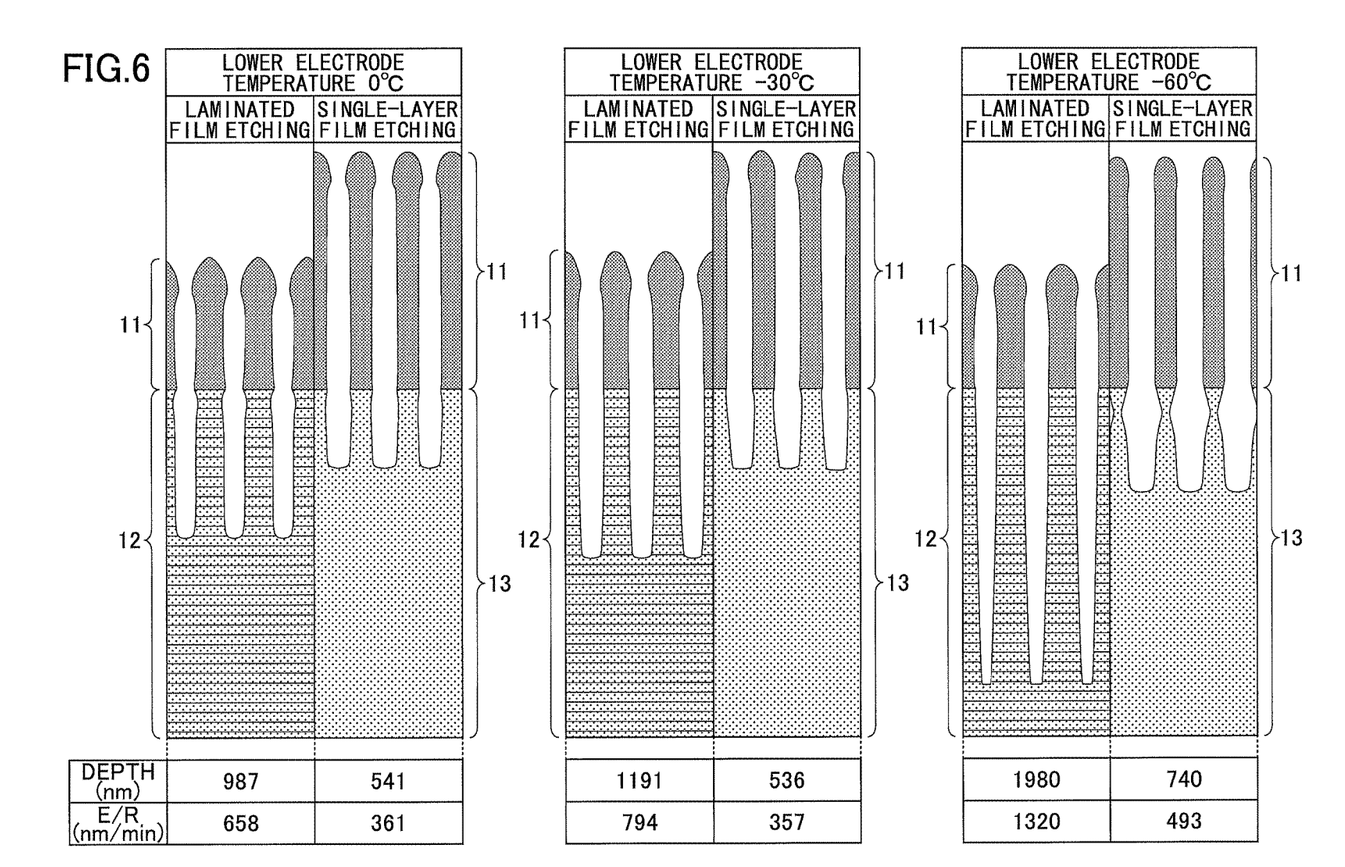
FIG. 6 is a diagram depicting an etching result at a very low temperature according to the first embodiment.

FIG. 6 depicts etching results in the cases where the temperature of the lower electrode was controlled to 0° C. (left), −30° C. (center), and −60° C. (right) under the following process condition. In this process, no optimization according to this embodiment was performed on the high-frequency electric power LF for biasing.

The process condition is as follows:
    Gas: $CF_4$, $H_2$, HBr, $NF_3$, $CH_2F_2$ and $CH_4$.

FIG. 6 shows that the etch rates of the laminated film 12 and the single-layer film 13 are higher at very low temperatures of −30° C. (center) and −60° C. (right) than at a low temperature of 0° C. (left). Because the etch rate of the laminated film 12 is higher than the etch rate of the single-layer film 13, however, the ratio of the etch rates of the laminated film 12 and the single-layer film 13 is far from 1:1.

Figure 7:
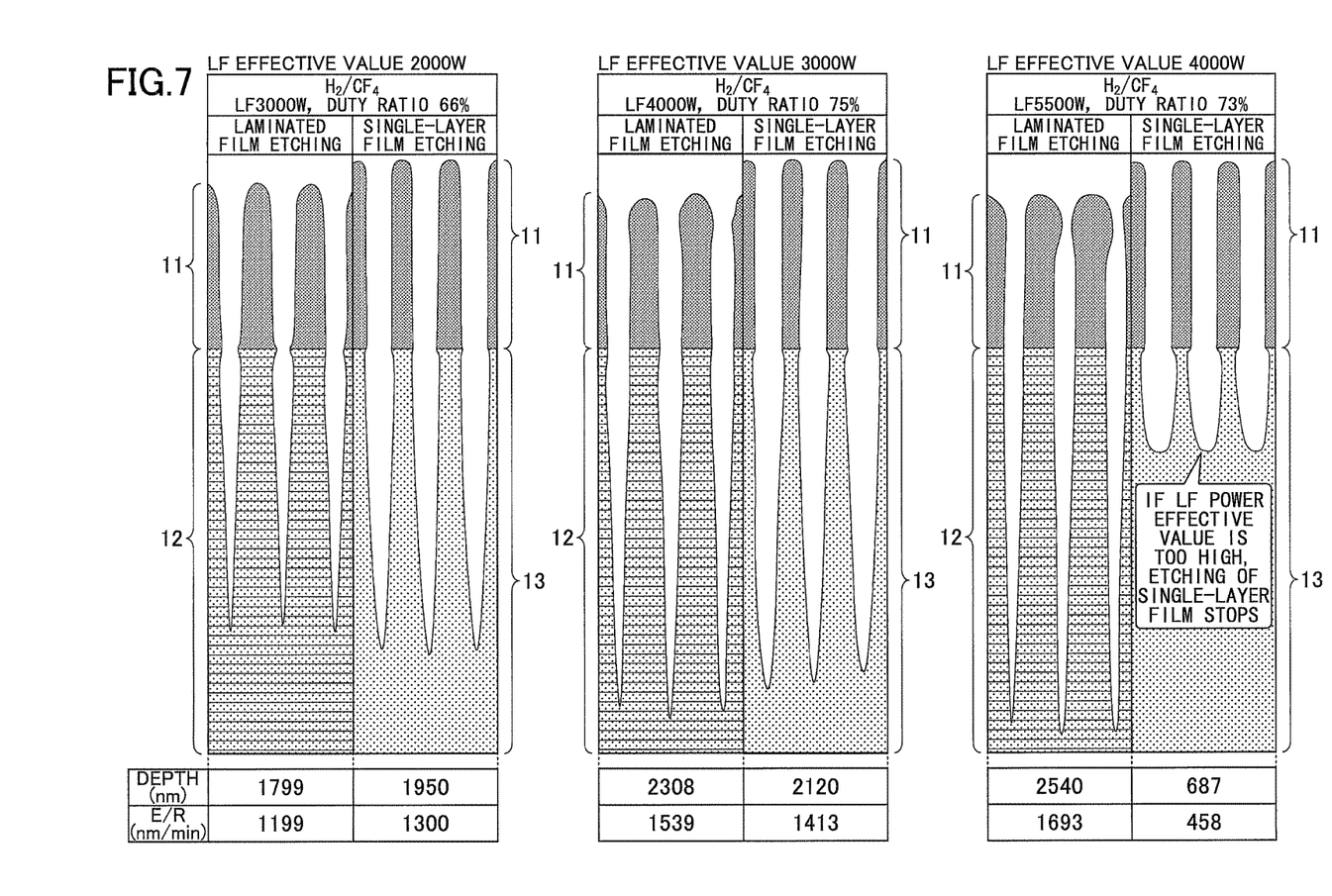
FIG. 7 is a diagram depicting an etching result at a very low temperature according to the first embodiment.

FIG. 7 depicts etching results in the cases where the effective value of the high-frequency electric power LF for biasing is controlled to 2000 W (left), 3000 W (center), and 4000 W (right) under the following process conditions. The process conditions are as follows:
    Lower electrode temperature: −60° C.,
    Gas: $CF_4$ and $H_2$, and
    LF: pulse wave of a frequency of 0.3 kHz.

According to the etching depicted on the left in FIG. 7, the high-frequency electric power LF for biasing is 3000 W with a duty ratio of 66%. Therefore, the effective value of the high-frequency electric power LF for biasing is approximately 2000 W. Furthermore, according to the etching depicted at the center of FIG. 7, the high-frequency electric power LF for biasing is 4000 W with a duty ratio of 75%. Therefore, the effective value of the high-frequency electric power LF for biasing is approximately 3000 W. Furthermore, according to the etching depicted on the right in FIG. 7, the high-frequency electric power LF for biasing is 5500 W with a duty ratio of 73%. Therefore, the effective value of the high-frequency electric power LF for biasing is approximately 4000 W.

FIG. 7 shows that the etch rate differs depending on the magnitude of the high-frequency electric power LF for biasing at a very low temperature of −60° C. That is, according to the etching result depicted on the right in FIG. 7, because the effective value of the high-frequency electric power LF for biasing is high, the etch rate of the single-layer film 13 decreases, thus making it difficult to approximate the ratio of the etch rates of the laminated film 12 and the single-layer film 13 to 1:1. This shows that it is preferable to control the effective value of the high-frequency electric power LF for biasing to 2000 W to 3500 W in order to approximate the ratio of the etch rates of the laminated film 12 and the single-layer film 13 to 1:1.

As described above, according to the etching method of the first embodiment, the laminated film 12 of silicon oxide films and silicon nitride films and the single-layer film 13 of a silicon oxide film are etched using a plasma of $H_2$ gas and $CF_4$ gas in a very low temperature environment of −30° C. or lower. In the etching, the condition of the high-frequency electric power LF for biasing is optimized. This makes it possible to reduce a processing time while maintaining the etch rates, so that it is possible to improve productivity. According to the etching method of the first embodiment, it is possible to form holes or grooves of an aspect ratio of 40 or higher in a film that is an object of etching (an etching object film).

In the above description, $H_2$ gas and $CF_4$ gas are selected as gaseous species used in the etching method according to this embodiment. The gaseous species used in the etching method according to this embodiment, however, are not limited to these. For example, $CHF_3$ (trifluoromethane) gas or $NF_3$ gas may be used in place of $CF_4$ gas as a gaseous species used in the etching according to this embodiment. $CF_4$ gas, $CHF_3$ gas, and $NF_3$ gas are examples of fluorine-containing gases. Furthermore, $H_2$ gas is an example of a hydrogen-containing gas. With these gases as well, it is possible to approximate the ratio of the etch rates of the laminated film 12 and the single-layer film 13 to 1:1 while maintaining the etch rates, and it is possible to reduce a processing time and improve productivity. That the ratio of the etch rates of the laminated film 12 and the single-layer film 13 becomes 1:1 or approximates 1:1 refers to the case where the difference between the etch rates of the laminated film 12 and the single-layer film 13 is within ±20% of the etch rate of the laminated film 12. For example, letting the etch rate of the laminated film 12 be 1, the ratio of the etch rates of the laminated film 12 and the single-layer film 13 becomes 1:1 or approximates 1:1 so that it is possible to achieve the effect of this embodiment, when the etch rate of the single-layer film 13 falls within the range of 0.8 to 1.2.

Second Embodiment

Etching according to a second embodiment is described below.

In the first embodiment, the etching method that reduces the processing time of films that are objects of etching while maintaining the etch rates of the films is described. Meanwhile, if the etch rate of the single-layer film 13 of a silicon oxide film is further increased so as to improve productivity, a phenomenon in which the tip of a hole formed by etching twists (hereinafter referred to as "twisting") occurs, thus resulting in degradation of the shape formed by etching.

Figure 8:
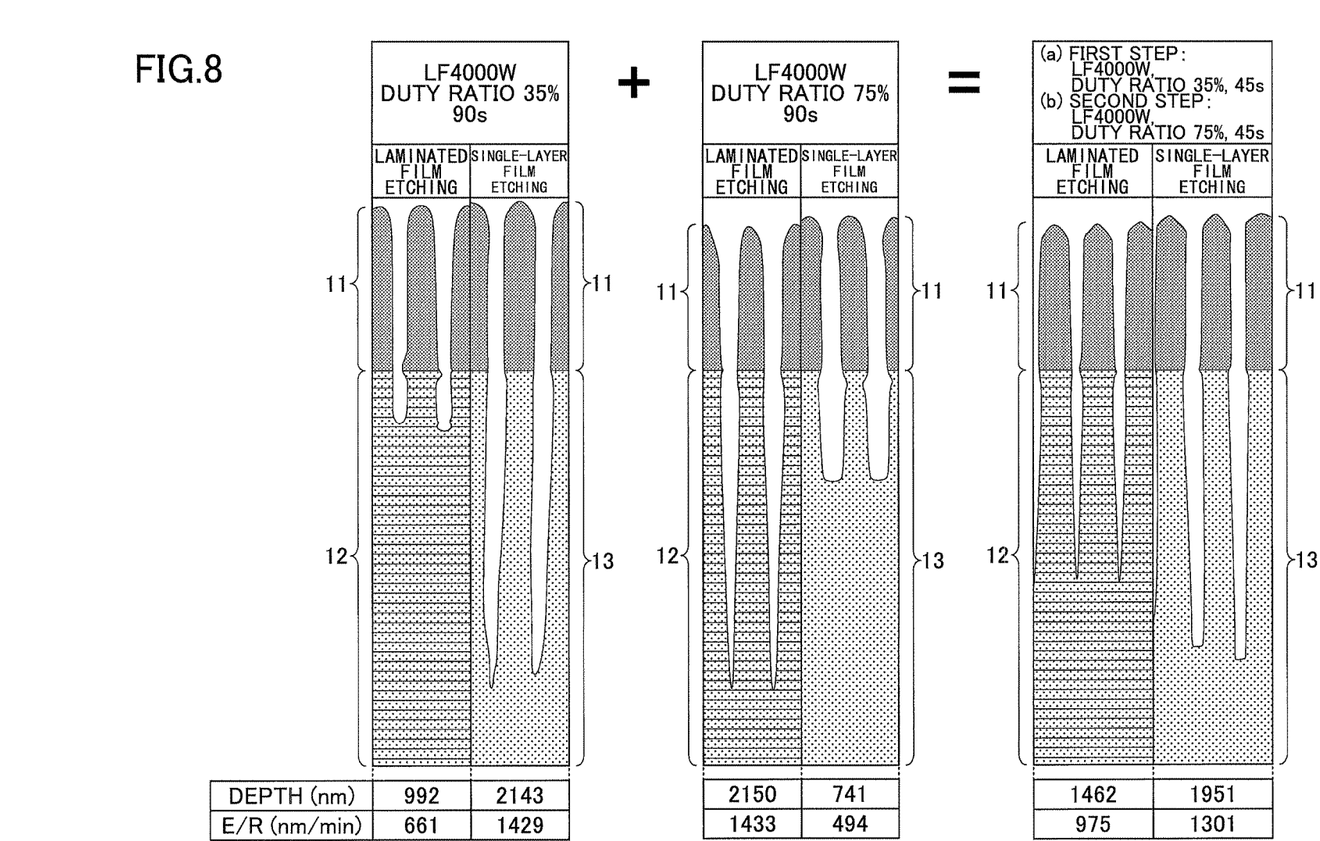
FIG. 8 is a diagram depicting an etching result at a very low temperature according to the first embodiment.

For example, a result of etching performed under process conditions that cause the etch rate to be higher for the single-layer film 13 (hereinafter also referred to as "first process conditions") is depicted on the left in FIG. 8. Furthermore, a result of etching performed under process conditions that cause the etch rate to be higher for the laminated film 12 (hereinafter also referred to as "second process conditions") is depicted at the center of FIG. 8. The first and second process conditions are as follows:

(a) First process conditions (conditions that cause the etch rate to be higher for the single-layer film 13, FIG. 8, left):
 Lower electrode temperature: −60° C.,
 Gas: $CF_4$ and $H_2$,
 LF: 4000 W pulse wave of a frequency of 0.3 kHz with a duty ratio of 35%, and
 Etching time: 90 s.
(b) Second process conditions (conditions that cause the etch rate to be higher for the laminated film 12, FIG. 8, center):
 Lower electrode temperature: −60° C.,
 Gas: $CF_4$ and $H_2$,
 LF: 4000 W pulse wave of a frequency of 0.3 kHz with a duty ratio of 75%, and
 Etching time: 90 s.

The first process conditions and the second process conditions are equal except for having different duty ratios. According to first etching under the first process conditions, the etch rate of the single-layer film 13 is higher than the etch rate of the laminated film 12 as depicted on the left in FIG. 8. Furthermore, twisting occurs in the first etching.

On the other hand, according to second etching under the second process conditions, the etch rate of the laminated film 12 is higher than the etch rate of the single-layer film 13 as depicted at the center of FIG. 8. Furthermore, no twisting occurs in the second etching.

That is, as the effective value of the high-frequency electric power LF for biasing becomes lower, the etch rate of the single-layer film 13 becomes higher than the etch rate of the laminated film 12, but twisting is more likely to occur. To be more specific, under the first process conditions, the etch rate of the single-layer film 13 becomes higher than the etch rate of the laminated film 12, and twisting is more likely to occur as depicted on the left in FIG. 9. Meanwhile, under the second process conditions, the etch rate of the laminated film 12 is higher than the etch rate of the single-layer film 13, and twisting is less likely to occur.

Figure 9:
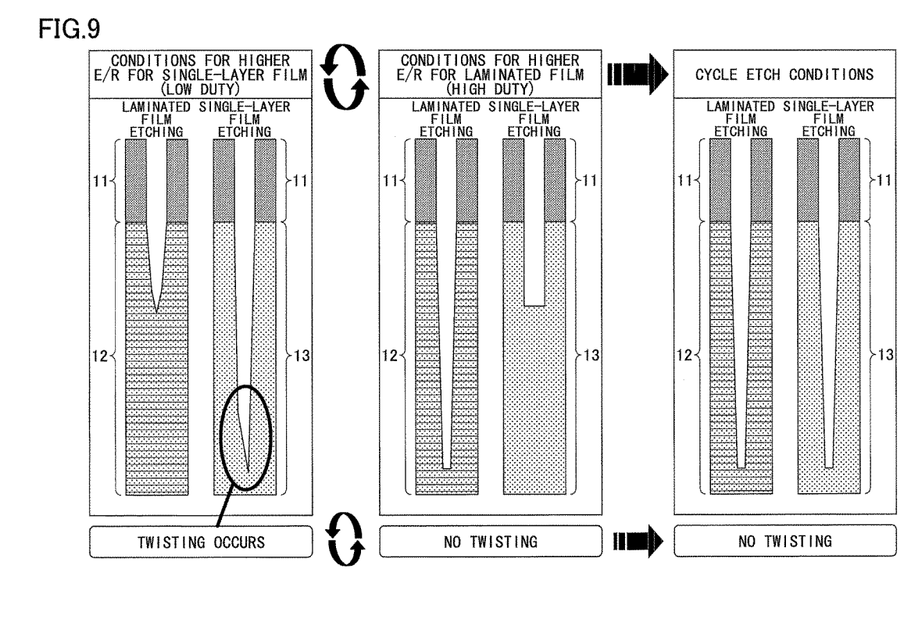
FIG. 9 a diagram depicting the outline of an etching method according to a second embodiment.

Therefore, according to the etching method of the second embodiment, the step of the first etching under the first process conditions (hereinafter referred to as "first step") and the step of the second etching under the second process conditions (hereinafter referred to as "second step") are alternately repeated as depicted on the right in FIG. 9. In the first step, the laminated film 12 and the single-layer film 13 are etched simultaneously or in parallel under the first process conditions. In the second step, the laminated film 12 and the single-layer film 13 are etched simultaneously or in parallel under the second process conditions. The process of etching the laminated film 12 and the single-layer film 13 by repeating the first step under the first process conditions and the second step under the second process conditions a predetermined number of times is hereinafter also referred to as "cycle etch". A result of the cycle etch is depicted on the right in FIG. 8. The process conditions of the cycle etch of FIG. 8 are as follows:

(a) First process conditions (first step):
 Lower electrode temperature: −60° C.,
 Gas: $CF_4$ and $H_2$,
 LF: 4000 W pulse wave of a frequency of 0.3 kHz with a duty ratio of 35%, and
 Etching time: 45 s.
(b) Second process conditions (second step):
 Lower electrode temperature: −60° C.,
 Gas: $CF_4$ and $H_2$,
 LF: 4000 W pulse wave of a frequency of 0.3 kHz with a duty ratio of 75%, and
 Etching time: 45 s.

According to this cycle etch, it is possible to eliminate the twisting of holes formed in the laminated film 12 and the single-layer film 13 while increasing the etch rates. As a result, it is possible to further increase productivity. Furthermore, it is possible to form holes or grooves of an aspect ratio of 40 or higher in an etching object film.

Figure 10A:
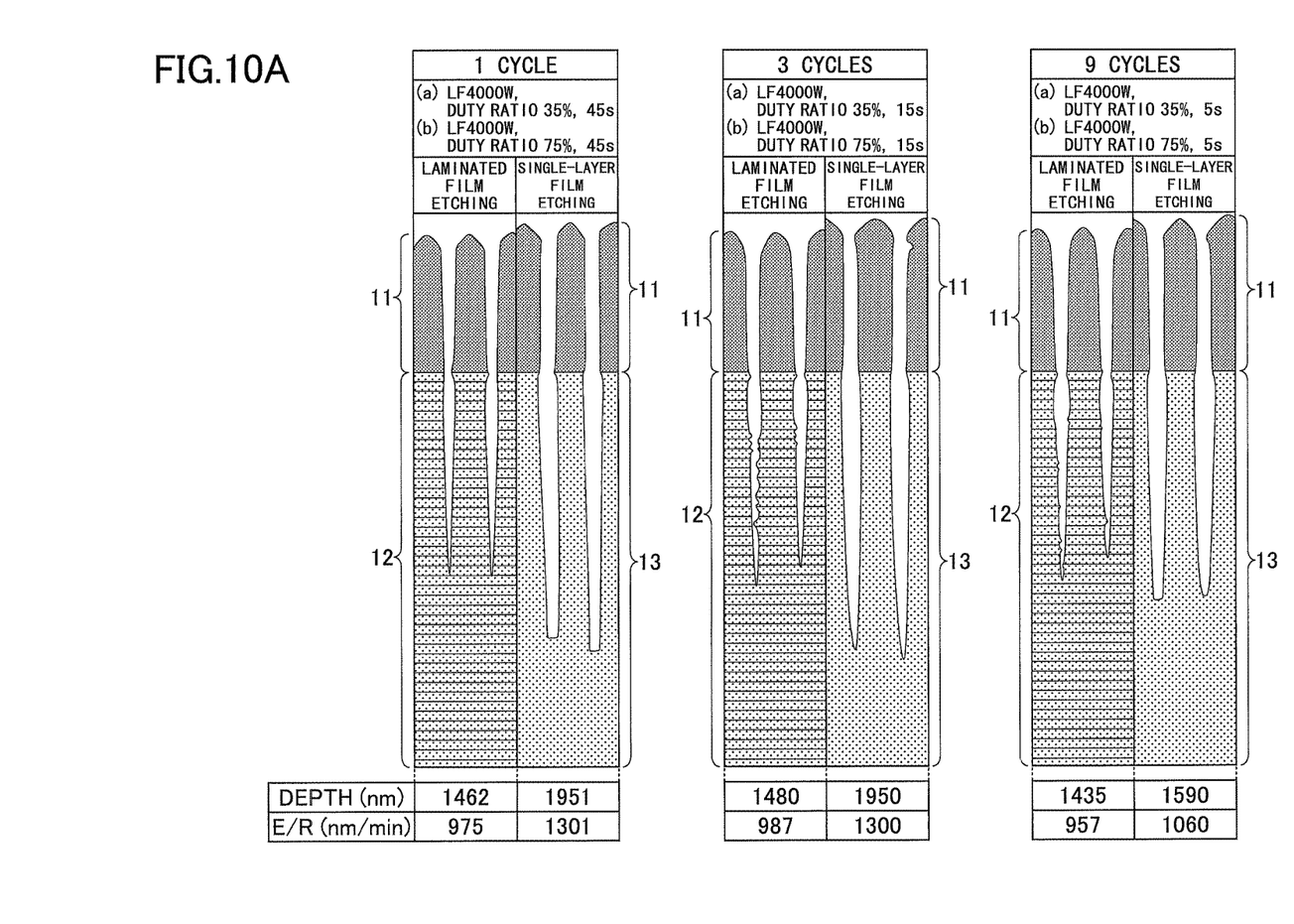
FIGS. 10A and 10B are diagrams depicting optimization of the number of cycles of the etching method according to the second embodiment.

Next, optimization of the number of cycles in the etching method according to the second embodiment is described with reference to FIGS. 10A and 10B. The process conditions of the cycle etches depicted on the left, at the center, and on the right in FIG. 10A are the same as those of the first step and the second step described above except for the number of cycles and the etching time of each step, where one cycle is an execution of the first step and the second step. Specifically, according to the cycle etch depicted on the left in FIG. 10A, the number of cycles is one and the etching time of each of the first step and the second step is 45 s. According to the cycle etch depicted at the center of FIG. 10A, the number of cycles is three and the etching time of each of the first step and the second step is 15 s. According to the cycle etch depicted on the right in FIG. 10A, the number of cycles is nine and the etching time of each of the first step and the second step is 5 s. The total etching time is common to the cycle etches of FIG. 10A.

Figure 10B:
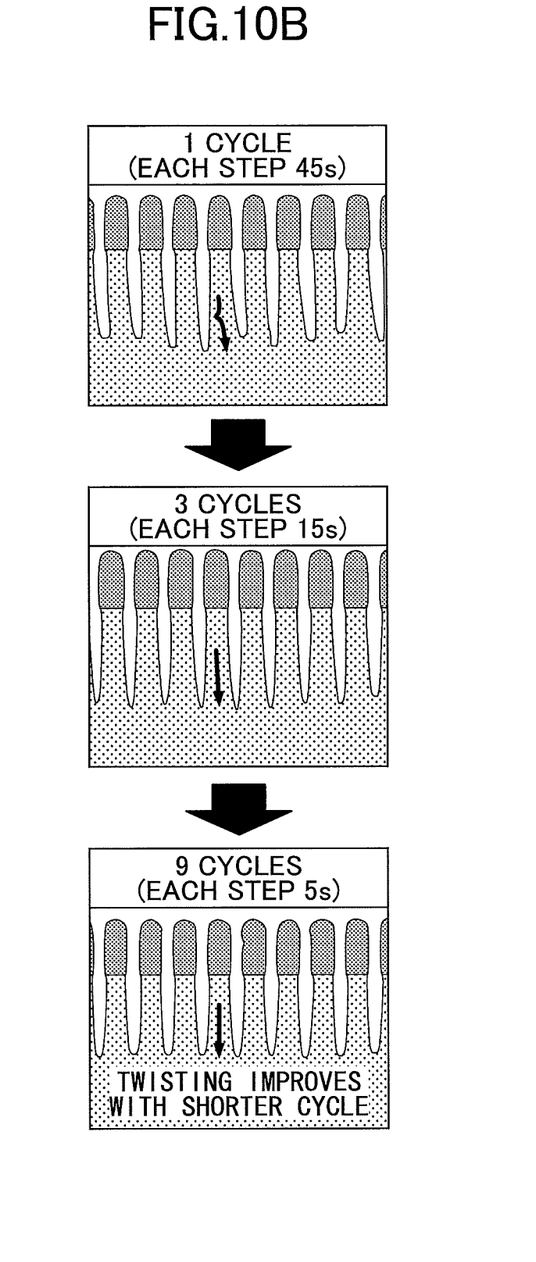

The diagrams at the top, in the middle, and at the bottom of FIG. 10B correspond to the cycle etches depicted on the left, at the center, and on the right in FIG. 10A, respectively. As depicted in FIG. 10B, as the etching time of one etching process decreases and the number of cycles increases, the shape of the tip of a hole formed by etching becomes vertical, and twisting is eliminated. As a result, according to the etching method of this embodiment, the same as in the first embodiment, it is possible to equalize or approximate the ratio of the etch rates of the laminated film 12 and the single-layer film 13 to 1:1 by controlling the etch rates of the laminated film 12 and the single-layer film 13 by controlling the high-frequency electric power LF for biasing. In addition, it is possible to eliminate the twisting of holes formed by etching by reducing the etching time of each of the first step under the first process conditions and the second step under the second process conditions and increasing the number of cycles.

Figure 11:
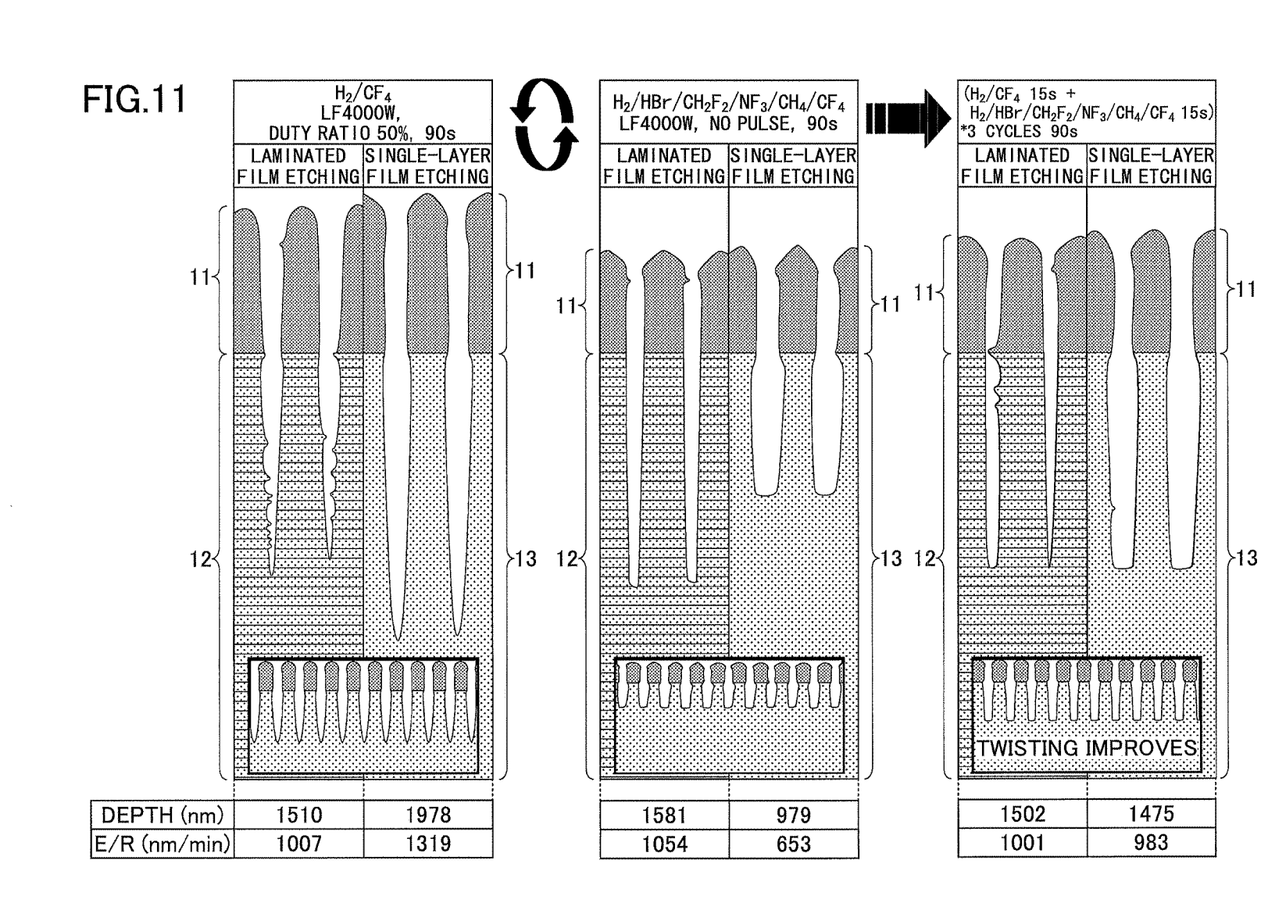
FIG. 11 is a diagram depicting an etching result according to a variation of the second embodiment.

An etching method according to a variation of the second embodiment is described with reference to FIG. 11. The process conditions of a cycle etch according to the variation are as follows:

(a) First process conditions (conditions that cause the etch rate to be higher for the single-layer film 13, FIG. 11, left):
  Lower electrode temperature: −60° C.,
  Gas: $CF_4$ and $H_2$,
  LF: 4000 W pulse wave of a frequency of 0.3 kHz with a duty ratio of 50%, and
  Etching time: 90 s.
(b) Second process conditions (conditions that cause the etch rate to be higher for the laminated film 12, FIG. 11, center):
  Lower electrode temperature: −60° C.,
  Gas: $CF_4$, $H_2$, HBr, $CH_2F_2$, $NF_3$, and $CH_4$,
  LF: 4000 W continuous wave (no pulse), and
  Etching time: 90 s.

The second process conditions of the second embodiment and the first process conditions of the variation are different in gaseous species and the presence or absence of LF pulses. Specifically, in the second process conditions, while $H_2$ gas and $CF_4$ gas are employed in the second embodiment, six kinds of gases, namely, $CF_4$, $H_2$, HBr, $CH_2F_2$, $NF_3$, and $CH_4$, are employed in the variation. Furthermore, in the second process conditions, while the high-frequency electric power LF for biasing is a pulse wave according to the second embodiment, the high-frequency electric power LF for biasing is not a pulse wave according to the variation.

According to the above-described process conditions, the etch rate of the single-layer film 13 is higher than the etch rate of the laminated film 12 as depicted on the left in FIG. 11 according to etching under the first process conditions. Under the first process conditions, however, twisting occurs near the tip of a hole formed in the single-layer film 13.

Meanwhile, according to etching under the second process conditions, the etch rate of the laminated film 12 is higher than the etch rate of the single-layer film 13 as depicted at the center of FIG. 11. Furthermore, no twisting occurs under the second process conditions.

Therefore, according to the etching method of the variation of the second embodiment, as depicted on the right in FIG. 11, a cycle etch that alternately repeats a first step of performing etching under the first process conditions of the variation and a second step of performing etching under the second process conditions of the variation is performed. The process conditions of the cycle etch are as follows:
(a) First step (first process conditions)
  Lower electrode temperature: −60° C.,
  Gas: $CF_4$ and $H_2$,
  LF: 4000 W pulse wave of a frequency of 0.3 kHz with a duty ratio of 50%, and
  Etching time: 15 s.
(b) Second step (second process conditions)
  Lower electrode temperature: −60° C.,
  Gas: $CF_4$, $H_2$, HBr, $CH_2F_2$, $NF_3$, and $CH_4$,
  LF: 4000 W continuous wave (no pulse), and
  Etching time: 15 s.

According to the cycle etch depicted on the right in FIG. 11, the number of cycles is three. This makes it possible to eliminate the twisting of holes while increasing the etch rates. As a result, it is possible to further increase productivity. Furthermore, it is possible to form holes or grooves of an aspect ratio of 40 or higher in an etching object film.

According to the etching methods of the second embodiment and its variation, the results are better with a shorter etching time for each etching (step) and a larger number of cycles. This is believed to be because it is possible to prevent occurrence of twisting in the first step by repeatedly performing etching by switching the first step under the first process conditions to the second step under the second process conditions before twisting occurs in the first step. The number of cycles may be two or more.

According to the etching methods of the second embodiment and its variation, the high-frequency electric power LF for biasing is controlled to 1000 W to 4000 W. That is, the high-frequency electric power LF for biasing per unit area applied to the lower electrode is controlled to 1.4 $W/cm^2$ to 5.7 $W/cm^2$. Furthermore, it is preferable to control the etch rates of the laminated film 12 and the single-layer film 13, so that the difference between the etch rates of the laminated film 12 and the single-layer film 13 is within ±20% of the etch rate of the laminated film 12.

As described above, according to the etching methods of the first embodiment, the second embodiment, and the variation of the second embodiment, it is possible to reduce a processing time and improve productivity in the case of etching different kinds of etching object films. In particular, according to the second embodiment and its variation, it is possible to eliminate the twisting of holes while maintaining the etch rates of the films through a cycle etch.

Etching methods are described above based on the embodiments of the present invention. The present invention, however, is not limited to the specifically disclosed embodiments, and variations and modifications may be made without departing from the scope of the present invention. Configurations described in the embodiments may be combined to the extent that there is no inconsistency between the configurations.

For example, an etching method according to an embodiment of the present invention may be applied to not only CCP processing apparatuses but also other etching apparatuses. Examples of other etching apparatuses include inductively coupled plasma (ICP) apparatuses, plasma processing apparatuses using a radial line slot antenna, helicon wave plasma (HWP) apparatuses, and electron cyclotron resonance (ECR) plasma apparatuses.

Furthermore, examples of substrates processed by an etching apparatus according to an aspect of the present invention include not only wafers but also large substrates for a flat panel display (FPD), electroluminescence (EL) elements, and substrates for a solar battery.

What is claimed is:

1. An etching method, comprising:
  generating a plasma from a hydrogen-containing gas and a fluorine-containing gas with high-frequency electric power for plasma generation; and
  etching a first film including a silicon oxide film and a silicon nitride film with the generated plasma in an environment at a temperature lower than or equal to −30° C.,
  wherein said etching includes controlling a first etch rate of first etching that etches the first film and a second etch rate of second etching that etches a second film having a structure different from a structure of the first film, so that a difference between the first etch rate and the second etch rate is within ±20% of the first etch rate.

2. The etching method as claimed in claim 1, wherein the hydrogen-containing gas is hydrogen gas, and the fluorine-containing gas is carbon tetrafluoride gas.

3. The etching method as claimed in claim 1, wherein the first film is a laminated film of alternating layers of silicon oxide films and silicon nitride films, and the second film is a single-layer film of a silicon oxide film.

4. The etching method as claimed in claim 1, wherein said generating generates the plasma between an upper electrode and a lower electrode, and said generating includes applying a pulse wave of high-frequency electric power for biasing to the lower electrode.

5. The etching method as claimed in claim 4, wherein said generating further includes controlling the high-frequency electric power for biasing per unit area applied to the lower electrode to 2.8 W/cm$^2$ to 5.0 W/cm$^2$.

6. The etching method as claimed in claim 4, wherein the lower electrode is formed of titanium.

7. The etching method as claimed in claim 1, wherein said etching includes performing the first etching and the second etching simultaneously or in parallel in the environment at the temperature lower than or equal to −30° C. and higher than or equal to −100° C.

8. An etching method, comprising:
generating a plasma from a gas mixture between an upper electrode and a lower electrode by applying high-frequency electric power for plasma generation to the upper electrode or the lower electrode and applying a pulse wave of high-frequency electric power for biasing to the lower electrode, the high-frequency electric power for biasing per unit area being 1.4 W/cm$^2$ to 5.7 W/cm$^2$, the gas mixture including a hydrogen-containing gas and a fluorine-containing gas;
controlling first etching and second etching in an environment at a temperature lower than or equal to −30° C., wherein the first etching etches a laminated film of a silicon oxide film and a silicon nitride film with the generated plasma and the second etching etches a single-layer film of a silicon oxide film with the generated plasma; and
repeating a first step and a second step a plurality of times, the first step performing the first etching and the second etching under a first process condition that causes an etch rate of the laminated film to be higher than an etch rate of the single-layer film, the second step performing the first etching and the second etching under a second process condition that causes the etch rate of the single-layer film to be higher than the etch rate of the laminated film,
wherein the first process condition and the second process condition have different duty ratios.

9. The etching method as claimed in claim 8, wherein said controlling includes controlling a first etch rate of the first etching and a second etch rate of the second etching, so that a difference between the first etch rate and the second etch rate is within ±20% of the first etch rate.

10. The etching method as claimed in claim 8, wherein the duty ratio of the second process condition is higher than the duty ratio of the first process condition.

11. The etching method as claimed in claim 8, wherein
the hydrogen-containing gas is hydrogen gas, and the fluorine-containing gas is carbon tetrafluoride gas, and
said generating generates the plasma from the gas mixture that further includes HBr, CH$_2$F$_2$, NF$_3$ and CH$_4$ under the second process conditions.

12. The etching method as claimed in claim 8, wherein said controlling includes performing the first etching and the second etching simultaneously or in parallel in the environment at the temperature lower than or equal to −30° C. and higher than or equal to −100° C.

13. The etching method as claimed in claim 8, wherein the lower electrode is formed of titanium.

* * * * *